(12) United States Patent
Webb et al.

(10) Patent No.: US 11,421,346 B2
(45) Date of Patent: Aug. 23, 2022

(54) ACTIVE CLEANING VACUUM SYSTEM AND METHOD

(71) Applicant: Linton Crystal Technologies Corporation, Rochester, NY (US)

(72) Inventors: Richard D. Webb, Rochester, NY (US); John A. Reese, Rochester, NY (US); Brian M. Repman, Rochester, NY (US); Joel C. Stefl, Rochester, NY (US)

(73) Assignee: Linton Crystal Technologies Corporation, Rochester, NY (US)

( * ) Notice: Subject to any disclaimer, the term of this patent is extended or adjusted under 35 U.S.C. 154(b) by 831 days.

(21) Appl. No.: 16/354,488

(22) Filed: Mar. 15, 2019

(65) Prior Publication Data

US 2020/0291543 A1    Sep. 17, 2020

(51) Int. Cl.
  *C30B 35/00* (2006.01)
  *C30B 23/00* (2006.01)
  *C30B 25/14* (2006.01)
  *C30B 27/02* (2006.01)
  *C30B 29/16* (2006.01)

(52) U.S. Cl.
  CPC ............ *C30B 35/007* (2013.01); *C30B 23/00* (2013.01); *C30B 25/14* (2013.01); *C30B 27/02* (2013.01); *C30B 29/16* (2013.01); *C30B 35/002* (2013.01)

(58) Field of Classification Search
  CPC ..... C30B 35/007; C30B 35/002; C30B 23/00; C30B 25/14; C30B 29/06; C30B 29/16
  See application file for complete search history.

(56) References Cited

U.S. PATENT DOCUMENTS

| | | | |
|---|---|---|---|
| 5,673,543 A | 10/1997 | Richardson | |
| 6,562,109 B2 * | 5/2003 | Livingston | ............ B01D 45/14 55/438 |
| 8,742,532 B2 * | 6/2014 | Rey Garcia | ......... H01L 31/1804 257/463 |

FOREIGN PATENT DOCUMENTS

DE    102012111896    *   6/2014

* cited by examiner

*Primary Examiner* — Robert M Kunemund
(74) *Attorney, Agent, or Firm* — Nixon Peabody LLP

(57) ABSTRACT

A vacuum system for silicon crystal growth includes a silicon crystal growth chamber, a first vacuum pipe, a second vacuum pipe, and an oxides container. The first vacuum pipe is coupled to the chamber and has within a first brush that is movable in a first direction for removing internal oxides. The second vacuum pipe is coupled to the first vacuum pipe for receiving the internal oxides via the first brush and has within a second brush that is movable in a second direction different from the first direction. The second brush transports the received internal oxides away from the first vacuum pipe. The oxides container is coupled to the second vacuum pipe for receiving the internal oxides via the second brush.

20 Claims, 15 Drawing Sheets

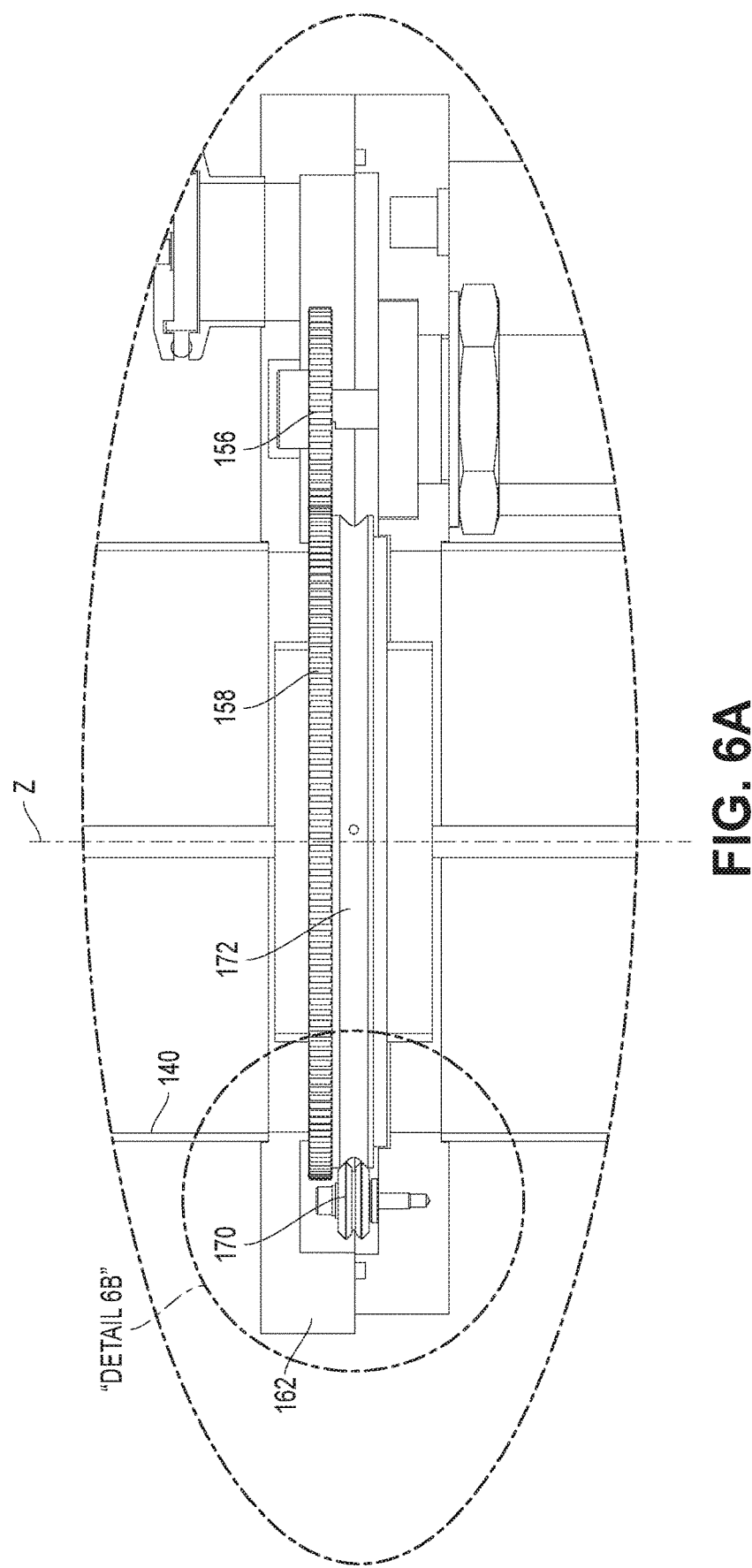

US 11,421,346 B2

ACTIVE CLEANING VACUUM SYSTEM AND METHOD

FIELD OF THE INVENTION

The present invention relates generally to a system for silicon crystal growth, and, more particularly, to system for removing atmosphere, including impurities, via vacuum pipes coupled to crystal growth chambers.

BACKGROUND OF THE INVENTION

Present silicon crystal growth systems require constant and often cleaning for removing impurities, including the byproduct of silicon crystal growth, i.e., silicon oxide (SiO). Typically, the cleaning process is required after each and every run of silicon crystal growth, being part of normal maintenance of a crystal grower. Problematically, current crystal growth systems require and implement a cleaning process that impedes run times for growing crystal with generally long cleanout times between runs. For example, manual intervention is required by cleaning staff after each run for thoroughly cleaning each of a plurality of main vacuum pipes. The frequency and length of each cleaning, which follows each crystal growth run, considerably delays the initiation of a next run, thus making present silicon crystal growth systems inefficient.

Thus, there is a great need for providing a cleaning system that prevents or reduces the above and other problems.

SUMMARY OF THE INVENTION

According to one embodiment of the present disclosure, a vacuum system for silicon crystal growth includes a silicon crystal growth chamber and a first vacuum pipe coupled to the chamber and having within a first brush that is movable in a first direction for removing internal oxides. The system further includes a second vacuum pipe coupled to the first vacuum pipe for receiving the internal oxides via the first brush. The second vacuum pipe has within a second brush that is movable in a second direction different from the first direction, the second brush transporting the received internal oxides away from the first vacuum pipe. The system also includes an oxides container coupled to the second vacuum pipe for receiving the internal oxides via the second brush.

According to another embodiment of the present disclosure, a vacuum system for silicon crystal growth includes a silicon crystal growth chamber operating in a vacuum environment, and a vertical vacuum pipe coupled to the chamber and including within a vertical brush. The vertical brush has a vertical bristles element that is rotatably movable around a central axis of the vertical vacuum pipe, the vertical bristles element removing deposited oxides in response to moving, frictional contact with an internal surface of the vertical vacuum pipe. The system further has a horizontal vacuum pipe coupled to the vertical vacuum pipe for receiving the oxides, the horizontal vacuum pipe including within a horizontal brush having an auger component that is rotatably movable around a central axis of the horizontal vacuum pipe. The auger component has a horizontal bristles element that makes moving, frictional contact with an internal surface of the horizontal vacuum pipe to transport the oxides along the horizontal vacuum pipe. The system further includes an oxides container coupled to the horizontal vacuum pipe for collecting the oxides received from the horizontal vacuum pipe.

According to yet another embodiment of the present disclosure, a method is directed to cleaning a vacuum system and includes operating a silicon crystal growth chamber in a vacuum environment, and rotatably moving a first brush along an internal surface of a first vacuum pipe to remove internal oxides. The first vacuum pipe has a first axis oriented in a first direction. The method further includes receiving the internal oxides from the first vacuum pipe within a second vacuum pipe. The second vacuum pipe has a second axis oriented in a second direction that is different than the first direction. The method also includes rotatably moving a second brush along an internal surface of the second vacuum pipe to move the internal oxides internally, and collecting the internal oxides in a container coupled to the second vacuum pipe.

Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

FIG. 6A is a side illustration showing components of the vertical drive mechanism illustrated in "Detail 6A" of FIG. 2.

Figure 1:
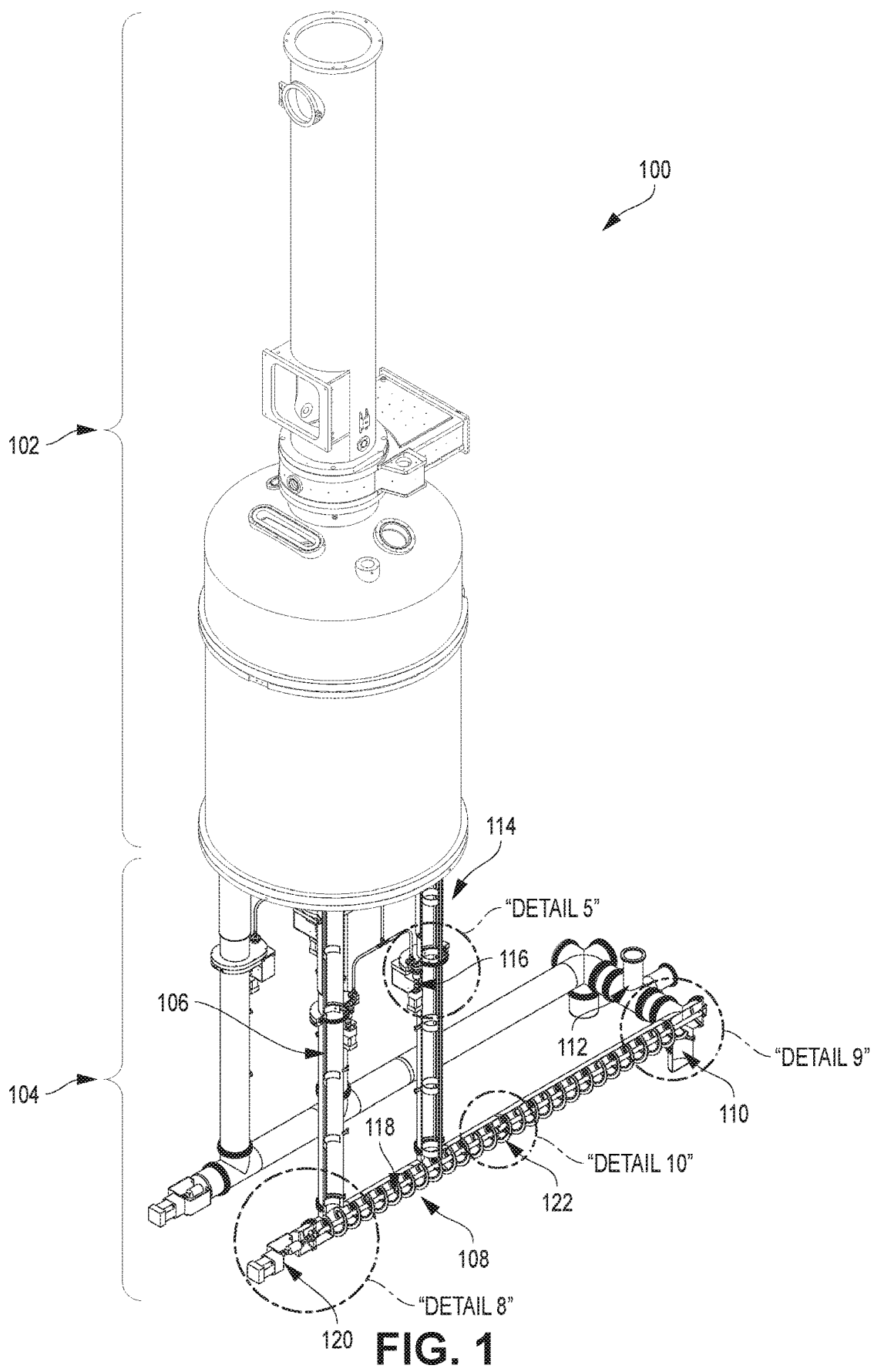
FIG. 1 is an isometric illustration of a vacuum system for silicon crystal growth.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION

Generally, an active cleaning vacuum system in accordance with the present disclosure is directed to minimizing the number of times that the main vacuum pipes of a vacuum system require cleaning, and to increasing the potential run times for cases of continuous growth. Accordingly, as described in more detail below, rotary cleaning brushes within the vacuum pipes provide continuous cleaning of the internal diameter of the vacuum pipes. Additionally, horizontal vacuum pipes have helical (auger) brushes that both clean and transport loose oxides to a collection container. Thus, the active cleaning vacuum system eliminates or reduces the need for manually cleaning the vacuum pipes after every growth run. Instead, maintenance personnel only need to remove and empty the collection container as needed, e.g., after every growth run. The active cleaning vacuum system further reduces the frequency for manual cleaning of the vacuum pipes, which may still be required as needed.

Figure 2:
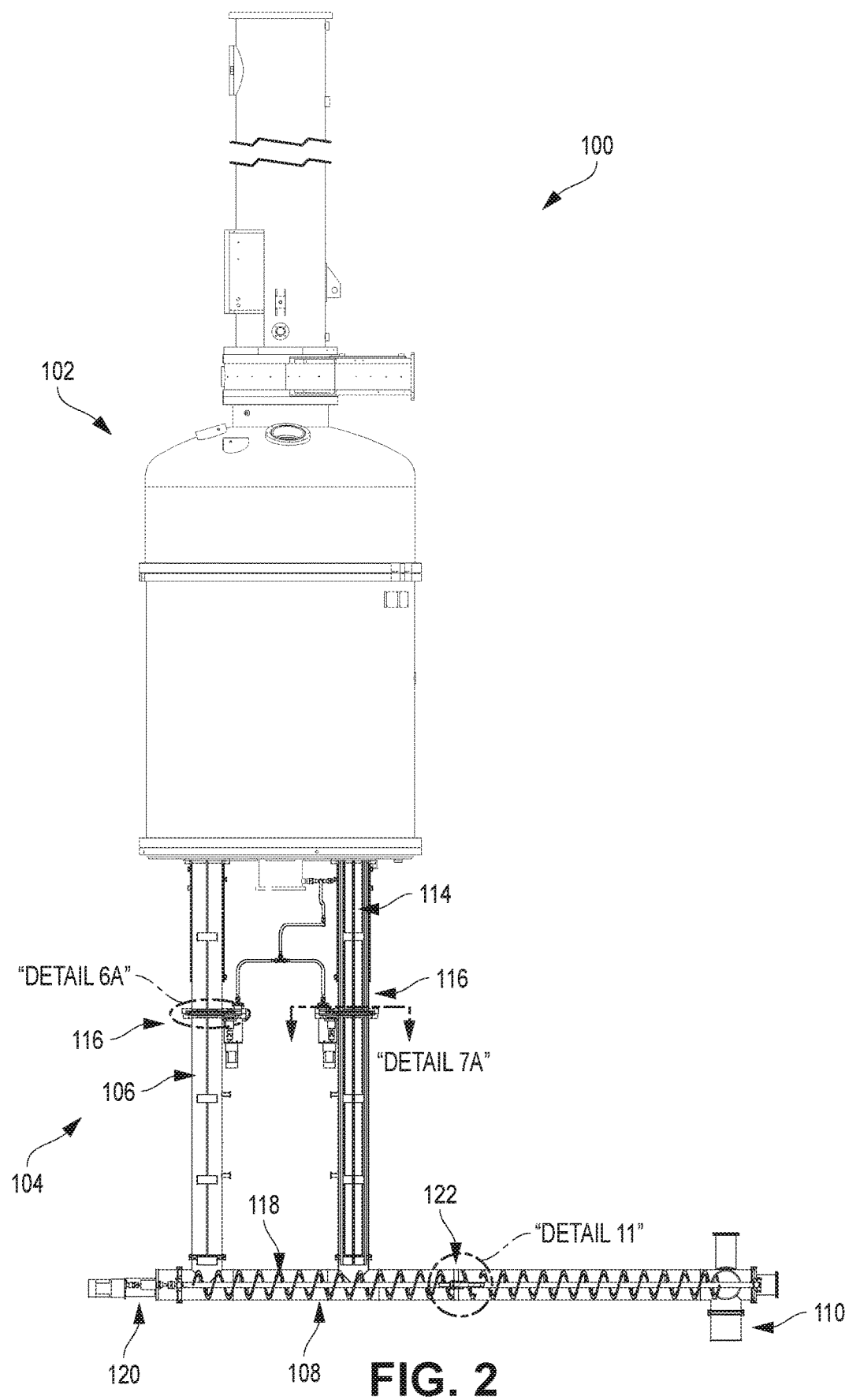
FIG. 2 is right side illustration of the system illustrated in FIG. 1.
Figure 3:
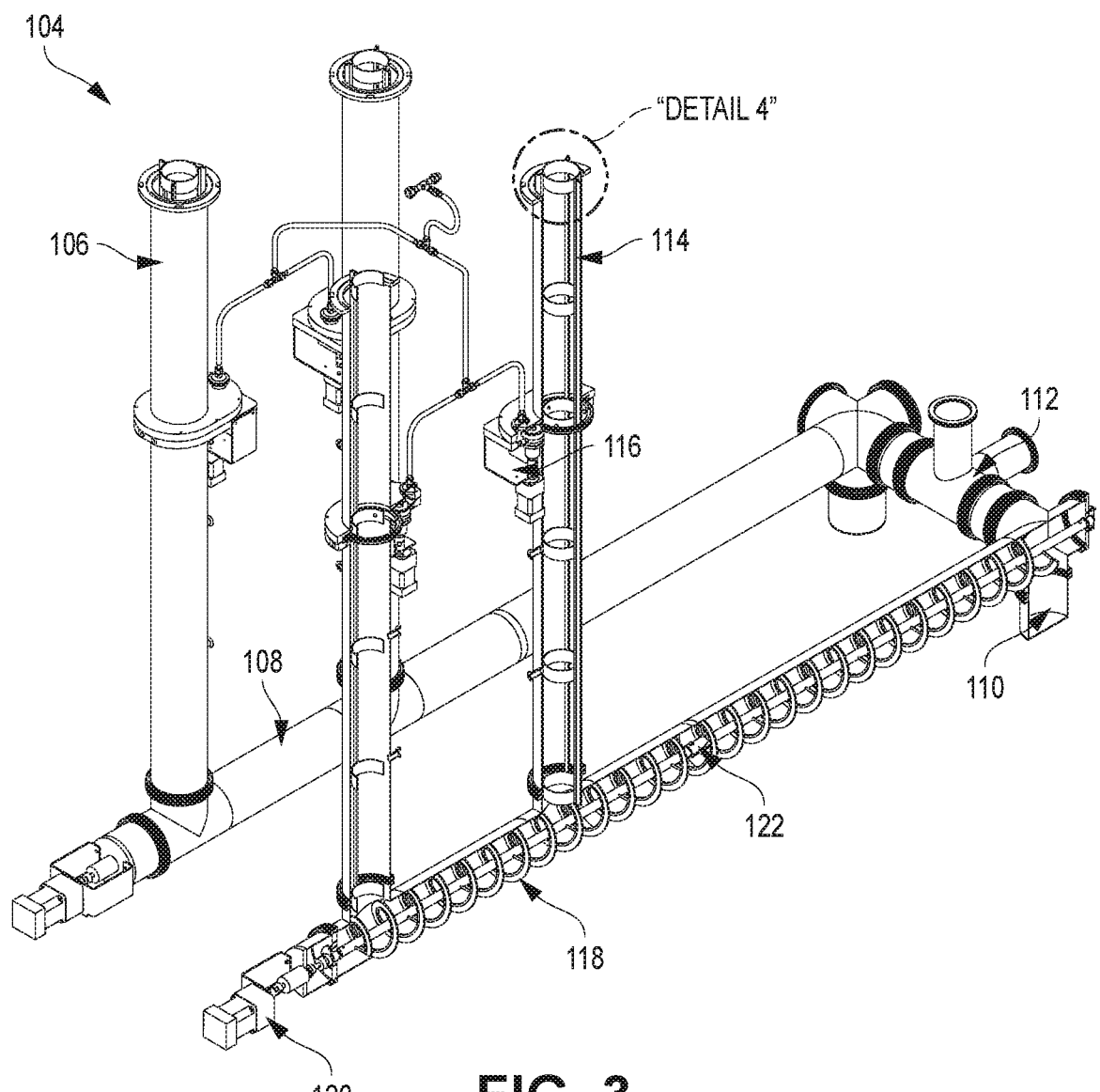
FIG. 3 is an isometric illustration of an active cleaning vacuum system of the vacuum system of FIG. 1.

Referring generally to FIGS. 1-3, a vacuum system 100 for silicon crystal growth includes one or more silicon crystal growth chambers 102 that are coupled to an active cleaning vacuum system 104. Silicon crystals are grown in the growth chamber 102 in accordance with the Czochralski Crystal Growth Process, while the active cleaning vacuum system 104 evacuates the growth chambers 102 through a series of pipes operating in a vacuum atmosphere. The cleaning vacuum system 104 removes the atmosphere within the growth environment of the growth chamber 102, including impurities, argon purge gas, and the byproduct of silicon crystal growth, i.e., silicon oxide (SiO).

Referring specifically to FIGS. 1 and 3, the active cleaning vacuum system 104 includes a plurality of vertical pipes 106 and horizontal pipes 108 coupling the growth chamber 102 to a plurality of oxides containers 110. Each vertical pipe 106 has an upper end connected to the growth chamber 102 and a lower end connected to a horizontal pipe 108, operating internally under vacuum and evacuating the atmosphere from the growth chamber 102 to the horizontal pipe 108. The horizontal pipe 108 also operates internally under vacuum and further evacuates the atmosphere received from the vertical pipe 106 to the oxides container 110.

In the illustrated embodiment, the vacuum system 100 includes four vertical pipes 106, two horizontal pipes 108, and two oxides containers 110. On one side of the growth chamber 102, two vertical pipes 106 are connected to a single horizontal pipe 108, which is connected to a single oxides container 110. On the other side of the growth chamber 102, a similar arrangement exists, with the two horizontal pipes 108 being connected to each other via a connecting pipe 112.

In accordance with other embodiments, the number and configuration of vertical and horizontal pipes is different, having less or more than the illustrated number of pipes. For example, in an alternative embodiment only a single vertical pipe 106 is connected to a single horizontal pipe 108. In another alternative embodiment, three or more vertical pipes 106 are connected to the same horizontal pipe 108. In yet another alternative embodiment, a single vertical pipe 106 is connected to two or more horizontal pipes 108. Other configurations, consistent with the principles disclosed herein, are also captured within the teachings of the present disclosure. For brevity and clarity, the disclosure below will typically refer to a single pipe 106, 108, but it is understood that the disclosure applies to all similar pipes.

Additionally, in alternative embodiments the orientations of the pipes 106, 108 is different than either vertical and/or horizontal. For example, in an alternative embodiment the vertical pipe 106 is a first pipe 106 having a first orientation (different than a vertical orientation) and the horizontal pipe 108 is a second pipe 108 having a second orientation (different than a horizontal orientation and different than the first orientation). By way of a more specific example, the first pipe 106 has an orientation inclined at a first angle ranging from 0-45 degrees relative to a vertical axis and the second pipe 106 has an orientation inclined at a second angle ranging from 0-45 degrees angle relative to a horizontal axis.

The vertical pipe 106 has a vertical rotating brush 114 that is coupled to a vertical drive mechanism 116. The horizontal pipe 108 has a horizontal helical rotating brush 118 that is coupled at one end to a horizontal drive mechanism 120 and at another end to the oxides container 110. The horizontal helical rotating brush 118 has at least one coupling joint 122 that separates it into at least two joined segments. Additional details are described below for each of these components.

Figure 4:
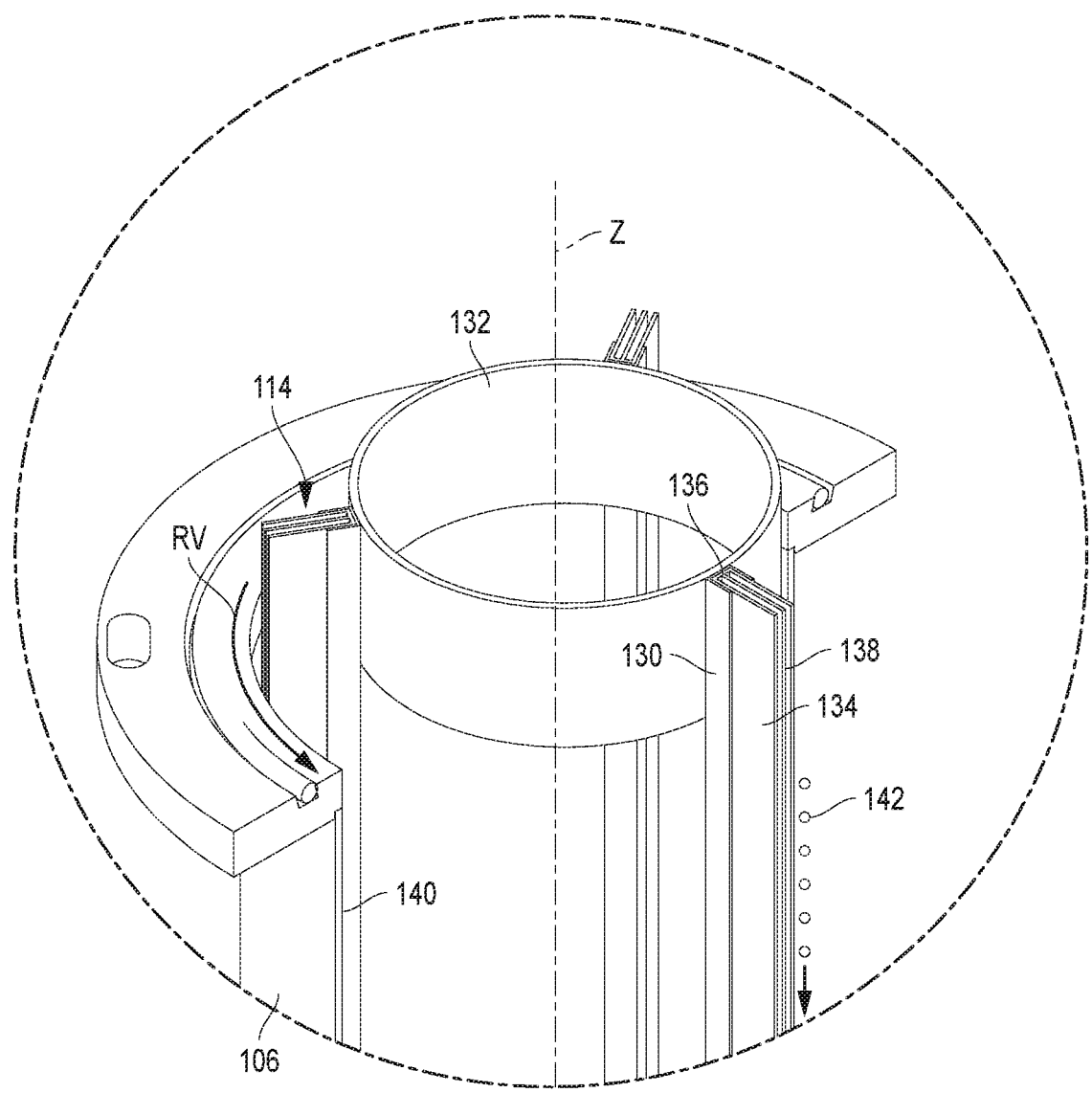
FIG. 4 is an enlarged isometric illustration of a top portion of a vertical rotating brush illustrated in "Detail 4" of FIG. 3.

Referring to FIG. 4, the vertical pipe 106 contains within the vertical rotating brush 114, which includes a plurality of channel strips 130 that are fixedly attached to a support ring 132 and that each contain a respective bristles element 134. In the illustrated embodiment, the vertical rotating brush 114 has three channel strips 130 symmetrically positioned around the outer periphery of the support ring 132, with each bristles element 134 having an interior end 136 contained within the respective channel strip 130 and having an exterior end 138 that makes moving contact with an internal surface 140 of the vertical pipe 106.

The support ring 132 is concentrically aligned with a central axis Z and near a top end of the vertical pipe 106. Additional support rings 132 are positioned along the vertical pipe 106 to provide adequate structural and operational support. For example, in the illustrated embodiment the vertical pipe 106 has a total of six support rings 132. However, in alternative embodiments the number of support rings 132 will differ based on the length of the vertical pipe 106 and the specific support design requirements.

According to one embodiment, the components of the vertical rotating brush 114 are made entirely or in part of metal materials. For example, the support ring 132, the channel strips 130, and the bristles elements 134 are all made of metal. According to alternative embodiments, the components of the vertical rotating brush 114 can include non-metal materials, based on the specific requirements of a particular vacuum system.

As the vertical rotating brush 114 rotates in a direction R, the bristles elements 134 make frictional contact with the internal surface 140 of the vertical pipe 106, resulting in the removal (e.g., scraping) of oxides 142 deposited in the internal surface 140. Based on gravity, the oxides 142 drop down and are temporarily collected within the horizontal pipe 108, prior to being further transported via the horizontal helical rotating brush 118 to the oxides container 110.

Figure 5:
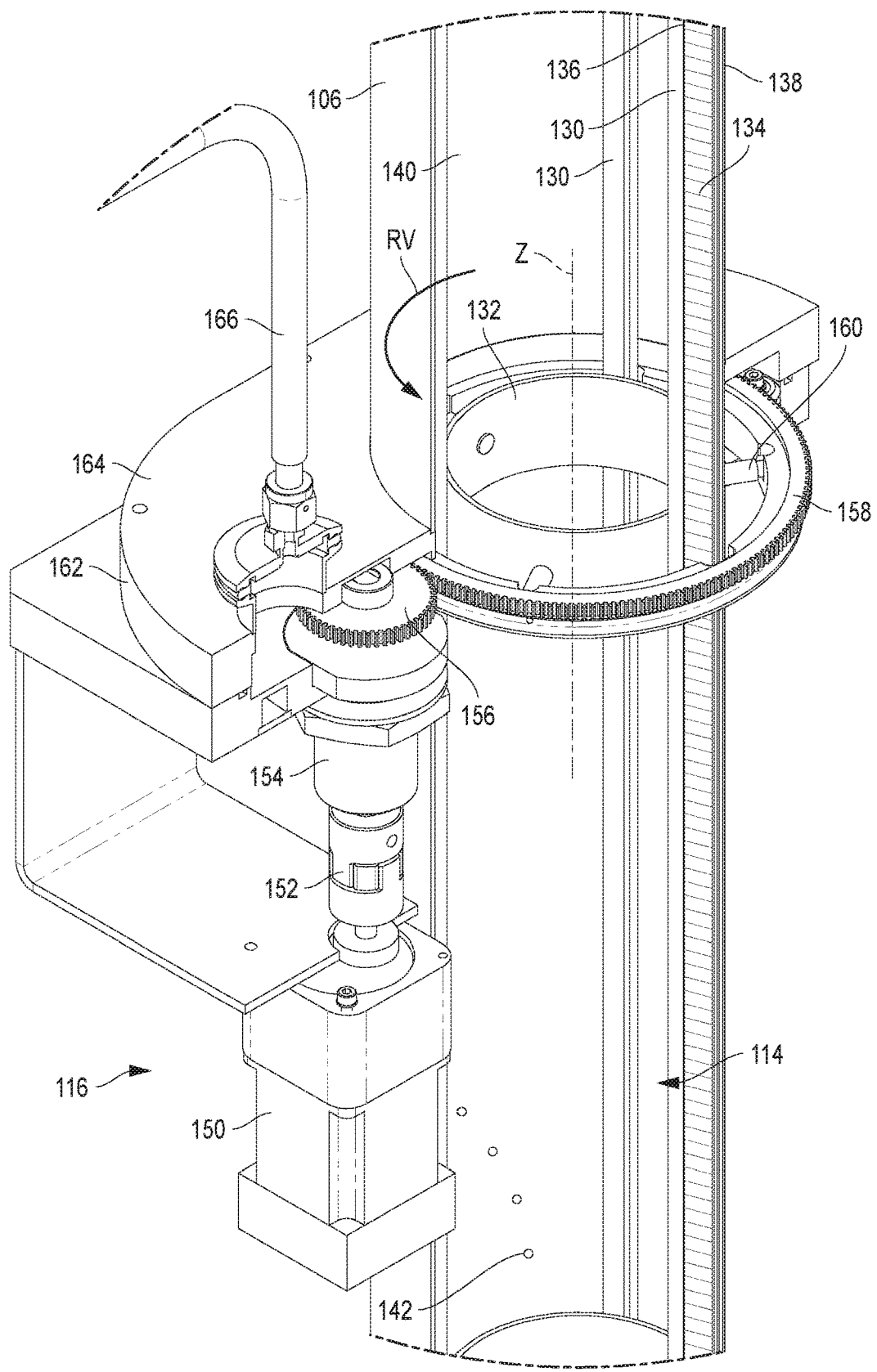
FIG. 5 is an isometric illustration of a vertical drive mechanism for the vertical rotating brush illustrated in "Detail 5" of FIG. 1.

Referring to FIG. 5, the vertical drive mechanism 116 includes a vertical stepper motor 150 that is connected to a drive coupling 152, which is in turn coupled to a magnetic fluid seal 154. The magnetic fluid seal 154 is further coupled to a brush drive gear 156 that is interengaged with and drives a brush driven gear 158. The brush driven gear 158 is concentrically aligned with a respective support ring 132, mounted such that an internal surface of the brush driven gear 158 is fixed to an exterior surface of the support ring 132 via a plurality of supporting pins 160 (e.g., three pins in the illustrated embodiment). The coupling of the vertical rotating brush 114 via the supporting pins 160 allows removal of the vertical rotating brush 114 without dismantling components of the vertical drive mechanism 116.

The vertical stepper motor 150 causes a rotation RV of the vertical rotating brush 114 around the Z axis, rotating the brush drive gear 156, which causes the rotation of the brush driven gear 158, which in turn causes the rotation of the respective support ring 132. The rotation of the respective support ring 132, which is rigidly connected to the other support rings 132 by the channel strips 130, causes the entire vertical rotating brush 114 to rotate and clean the internal surface 140 of the vertical pipe 106. Thus, the oxides 142 are removed from the interior of the vertical pipe 106.

The gears 156, 158 are enclosed within a drive gear housing 162 having a top surface 164 to which an argon gas pipe 166 is coupled. Argon gas is introduced through the argon gas pipe 166 internally into the drive gear housing 162 to maintain gear teeth of the gears 156, 158 and respective support bearings clean of SiO. Thus, the argon gas prevents, or reduces, the binding of the gear teeth.

Figure 6B:
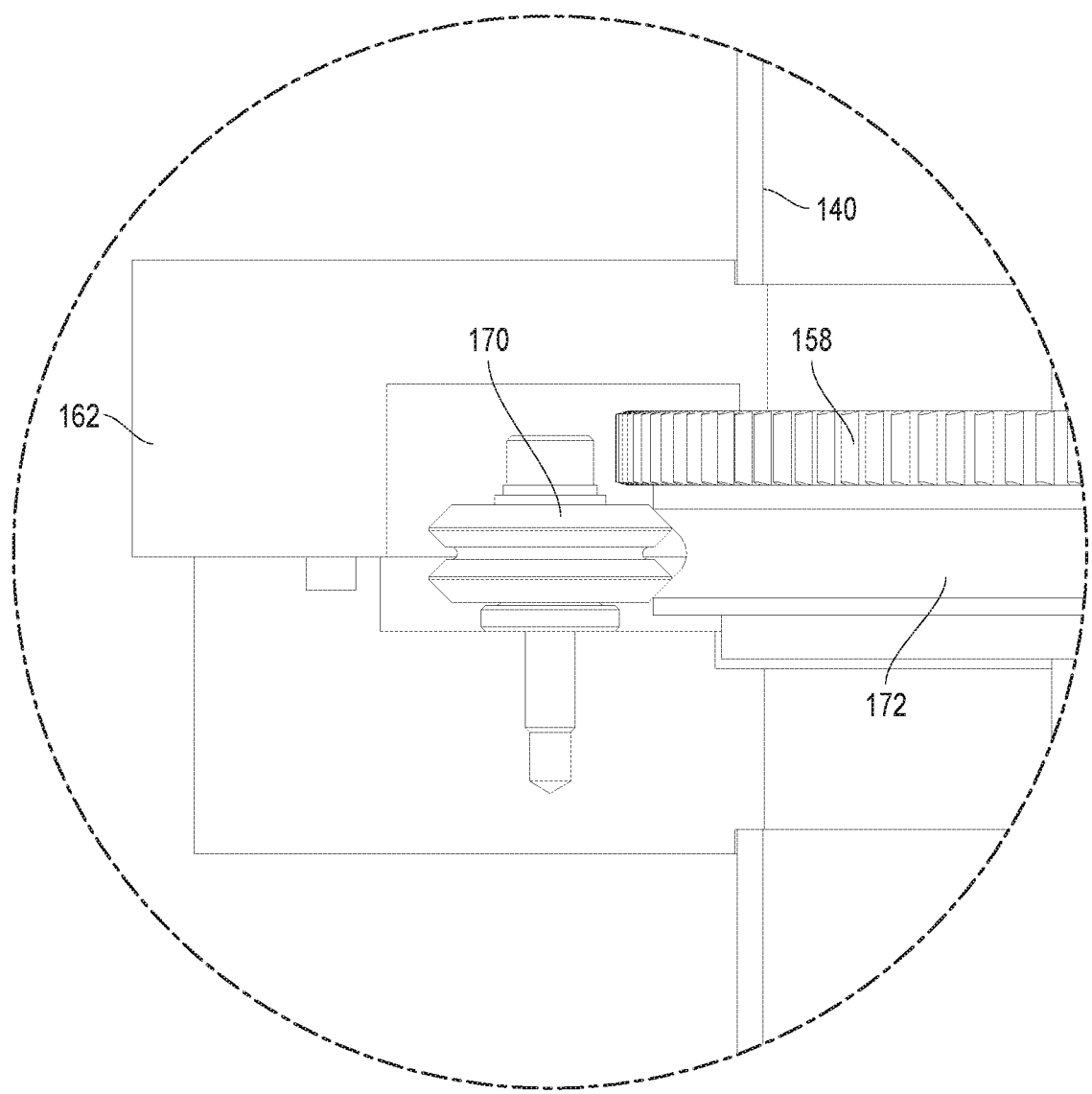
FIG. 6B is an enlarged illustration showing a bearing wheel component of FIG. 6A.

Referring to FIGS. 6A and 6B, the brush driven gear 158 is supported by one or more bearing wheels 170, which are V-shaped and engage a V-shaped groove 172 of the brush driven gear 158. The V-shaped groove 172 is located below and adjacent to the gear teeth of the brush driven gear 158. According to one embodiment, the brush driven gear 158 is supported by three bearing wheels 170 located symmetrically and equidistant from each other around the Z axis (see FIG. 7A).

Figure 7A:
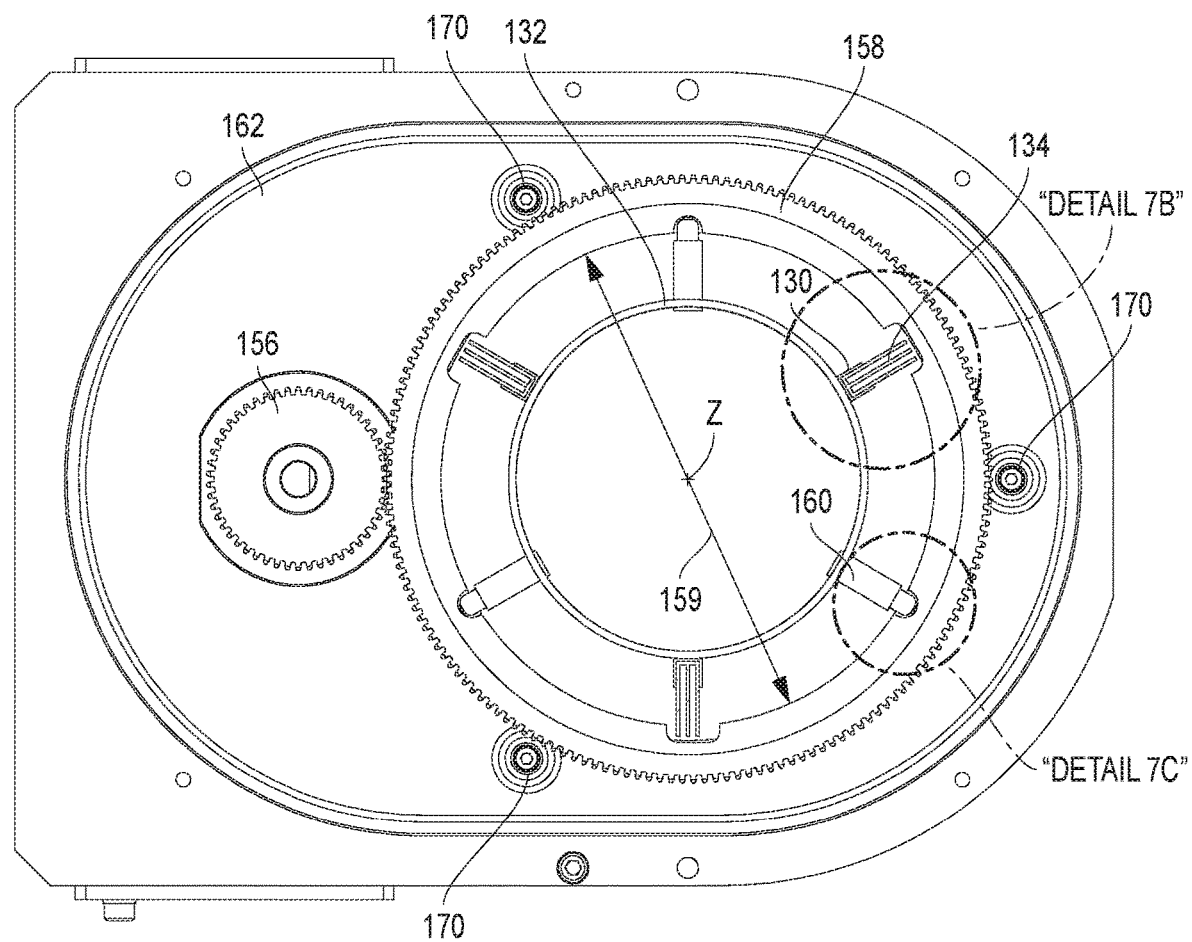
FIG. 7A is a top illustration of the vertical drive mechanism illustrated in "Detail 7A" of FIG. 2.
Figure 7B:
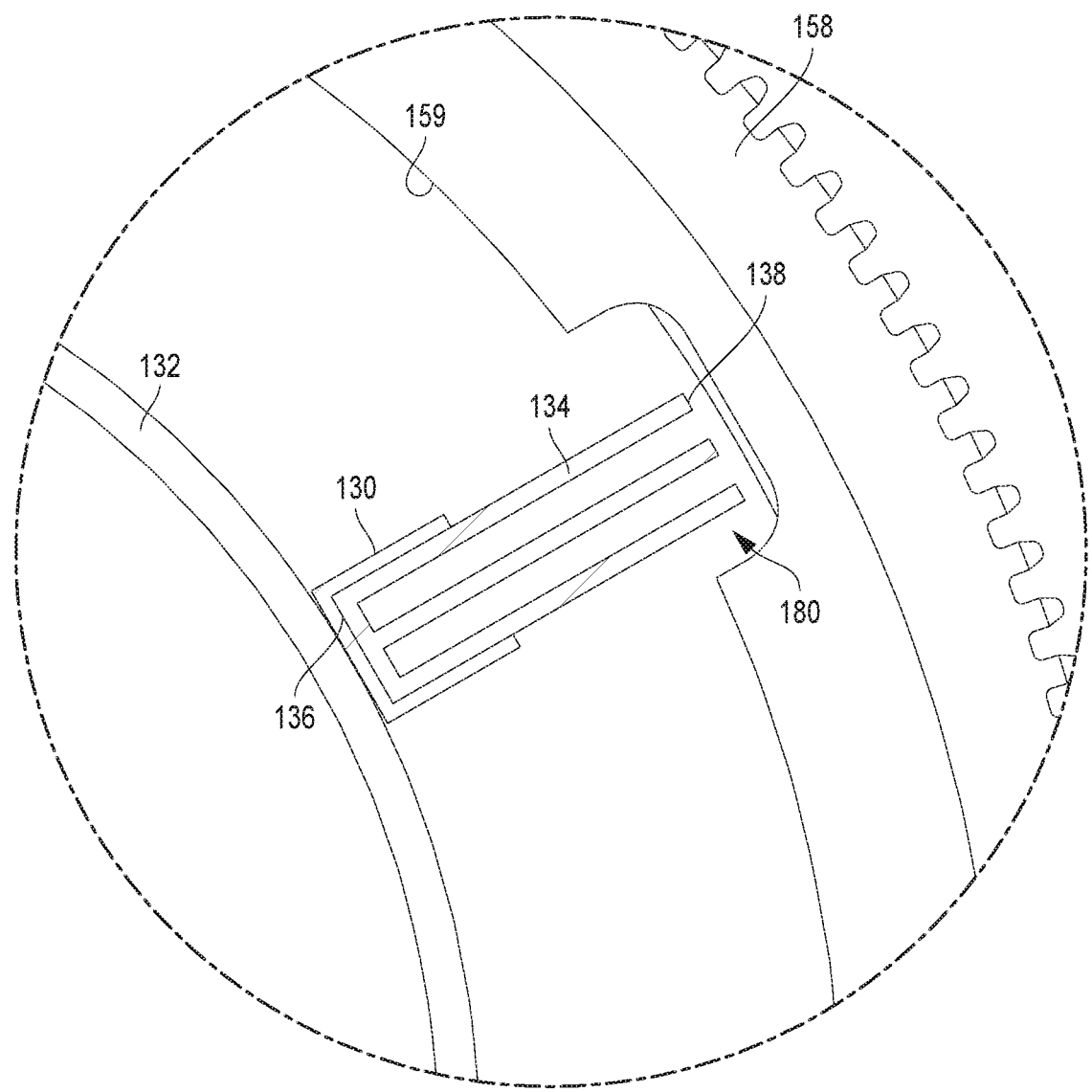
FIG. 7B is an enlarged illustration of a metal channel illustrated in "Detail 7B" of FIG. 7A.
Figure 7C:
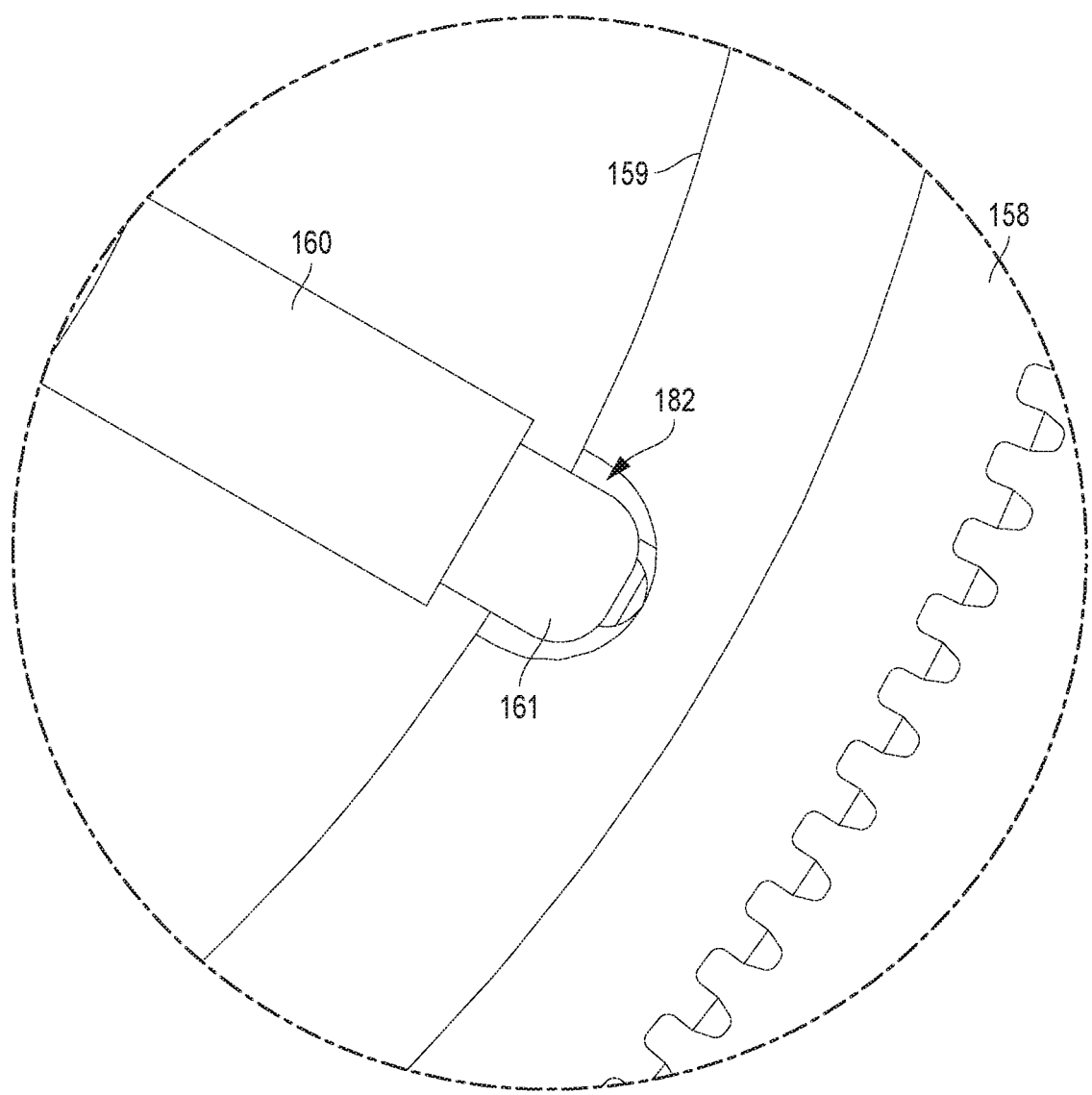
FIG. 7C is an enlarged illustration of a driven gear illustrated in "Detail 7C" of FIG. 7A.

Referring to FIGS. 7A-7C, the brush driven gear 158 has bristles pockets 180 and pin pockets 182 for receiving respective ones of the bristles elements 134 and the supporting pins 160. The bristles pockets 180 (shown more clearly in FIG. 7B) are shaped and curved inward to accommodate and receive the exterior end 138 of the bristles elements 134. Similarly, but not necessarily identically, the pin pockets 182 (shown more clearly in FIG. 7C) are shaped and curved inward to receive an exterior end 161 of the supporting pins 160. According to an exemplary embodiment, the bristles pockets 180 and the pin pockets 182 are machined into an internal diameter 159 of the brush driven gear 158.

Figure 8:
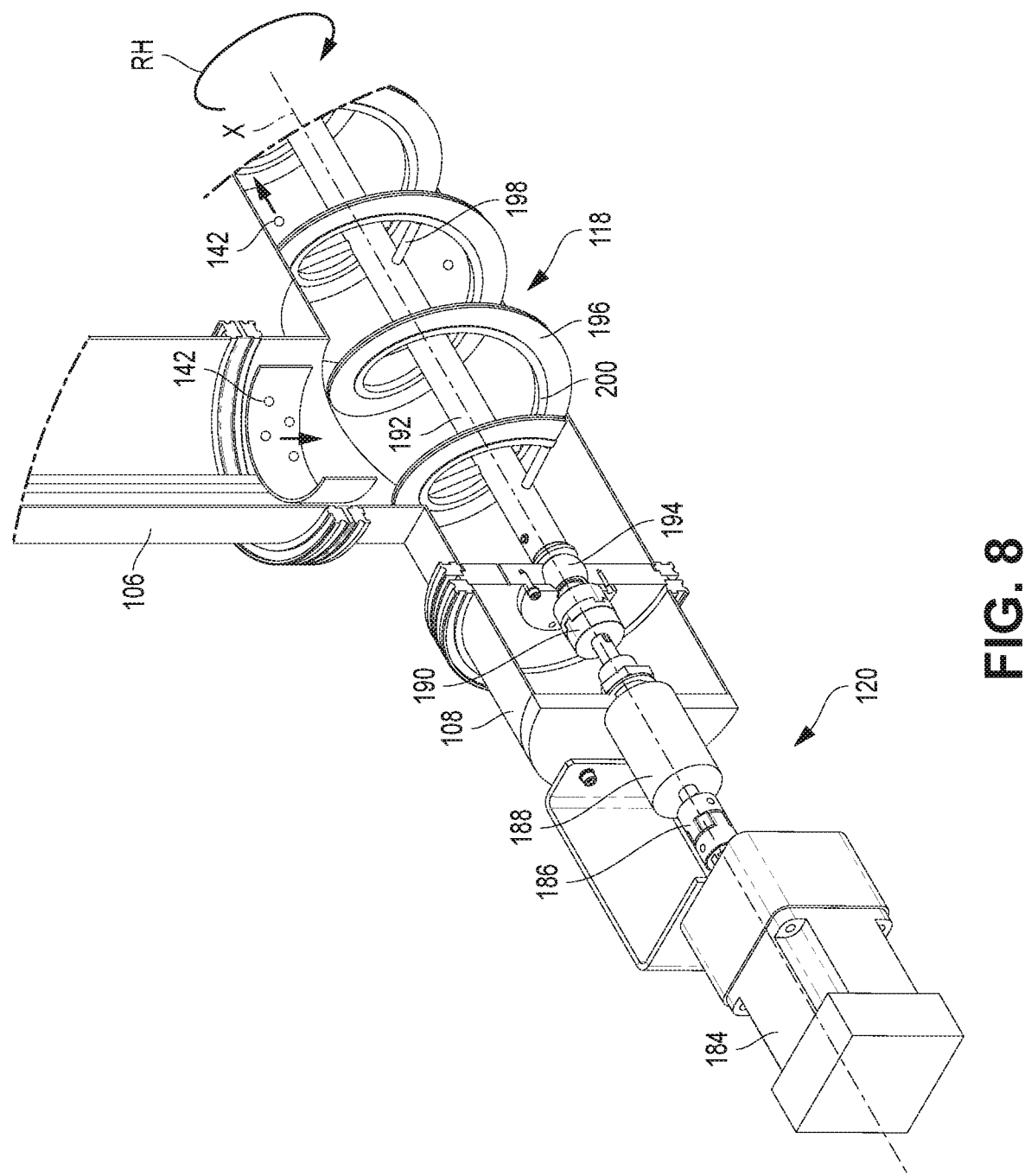
FIG. 8 is an isometric illustration of a horizontal helical rotating brush and horizontal drive components illustrated in "Detail 8" of FIG. 1.

Referring to FIG. 8, the horizontal drive mechanism 120 includes a horizontal stepper motor 184 that is connected to a first drive coupling 186, which is in turn coupled to a magnetic fluid seal 188. According to one exemplary embodiment and except for the horizontal orientation, the horizontal stepper motor 184, the drive coupling 186, and the magnetic fluid seal 188 are similar or identical to the vertical stepper motor 150 and its counterpart drive coupling 152 and magnetic fluid seal 154.

The magnetic fluid seal 188 of the horizontal drive mechanism 120 is further coupled to a second drive coupling 190 that is connected to a horizontal support shaft 192 of the horizontal helical rotating brush 118. The connection between the second drive coupling 190 and the horizontal support shaft 192 is made via a first support bearing 194. The first support bearing 194 has a spherical shape and is optionally made from a resin material. The shape and/or material of the first support bearing 194 allows rotation of the horizontal helical rotating brush 118 without causing binding at the first support bearing 194 if the horizontal helical rotating brush 118 is not completely straight. The horizontal support shaft 192 is coincident with and positioned along an X axis, and is driven by the horizontal stepper motor 184.

The horizontal helical rotating brush 118 includes a helical bristles element 196 that is directly attached to the horizontal support shaft 192 via a plurality of support spokes 198. The helical bristles element 196 is attached to and received partially within a spiral channel 200, which is generally similar to the channel strip 130 except that the spiral channel 200 has a spiral shape while the channel strip 130 has a straight, linear shape. The helical bristles element 196 is made entirely or partially with a metal material or with high-temperature resin bristles.

The spiral channel 200 is attached along its helix-like pitch to exterior ends of the support spokes 198, which have interior ends attached to the horizontal support shaft 192. The horizontal support shaft 192 has a hollow interior and acts as the spine of the horizontal helical rotating brush. When driven by the horizontal stepper motor 184, the horizontal helical rotating brush 118 acts as an auger that rotates in an RH direction around the X axis for transporting fallen and other accumulated oxides 142 through the internal diameter of the horizontal pipe 108 to the oxides container 110.

Figure 9:
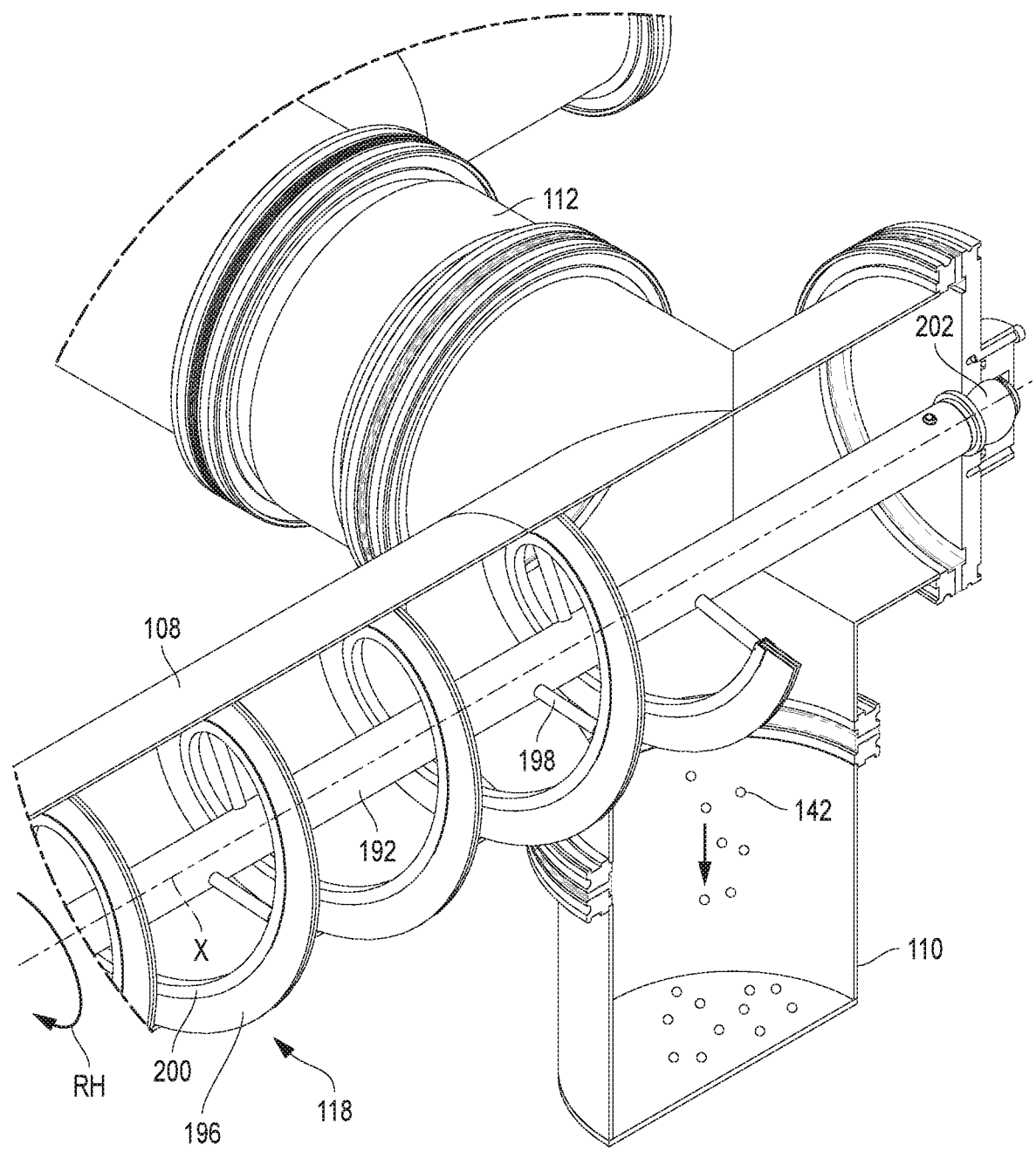
FIG. 9 is an isometric illustration of a horizontal pipe end and oxides container illustrated in "Detail 9" of FIG. 1.

Referring to FIG. 9, the horizontal helical rotating brush 118 is coupled to the oxides container 110 with an end of the horizontal support shaft 192 terminating at a second support bearing 202. The second support bearing 202, is optionally similar or identical to the first support bearing 194, having a spherical shape and being optionally made from a resin material. The shape and/or material of the second support bearing 202 also allows rotation of the horizontal helical rotating brush 118 without causing binding at the second support bearing 202 if the horizontal helical rotating brush 118 is not completely straight.

The oxides container 110 collects oxides 142 and other contaminants that are received via the horizontal helical rotating brush 118. As the horizontal helical rotating brush 118 rotates in the RH direction, the oxides 142 are being pushed by the helical bristles element 196 until the oxides 142 fall into the oxides container 110. The oxides container 110, as illustrated, is positioned at one end of the horizontal pipe 108 where it intersects with the connecting pipe 112. In other embodiments, the oxides container 110 is placed in other locations deemed suitable for collecting any contaminants, including the oxides 142.

Figure 10:
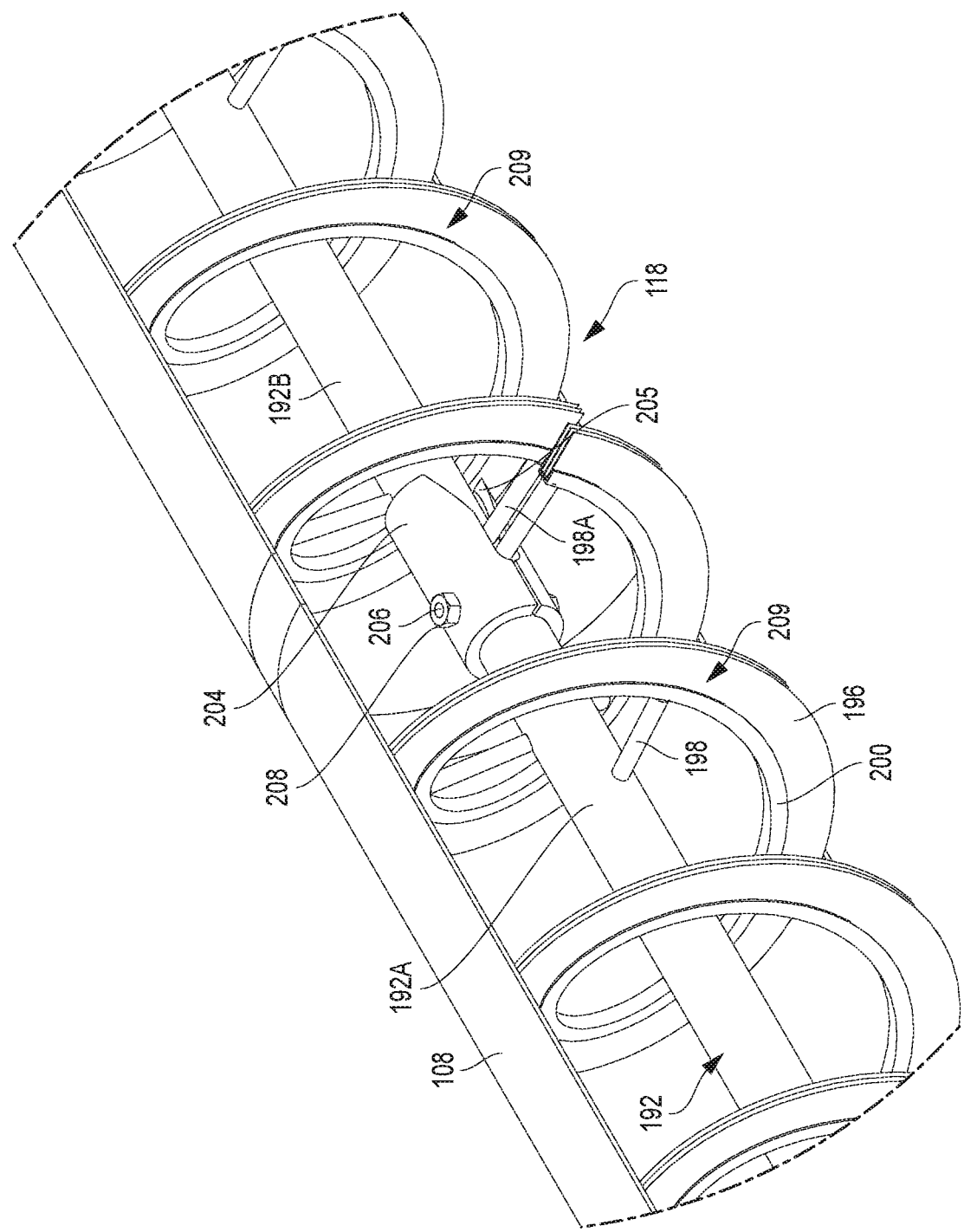
FIG. 10 is an isometric illustration of a coupling joint for a horizontal helical rotating brush illustrated in "Detail 10" of FIG. 1.
Figure 11:
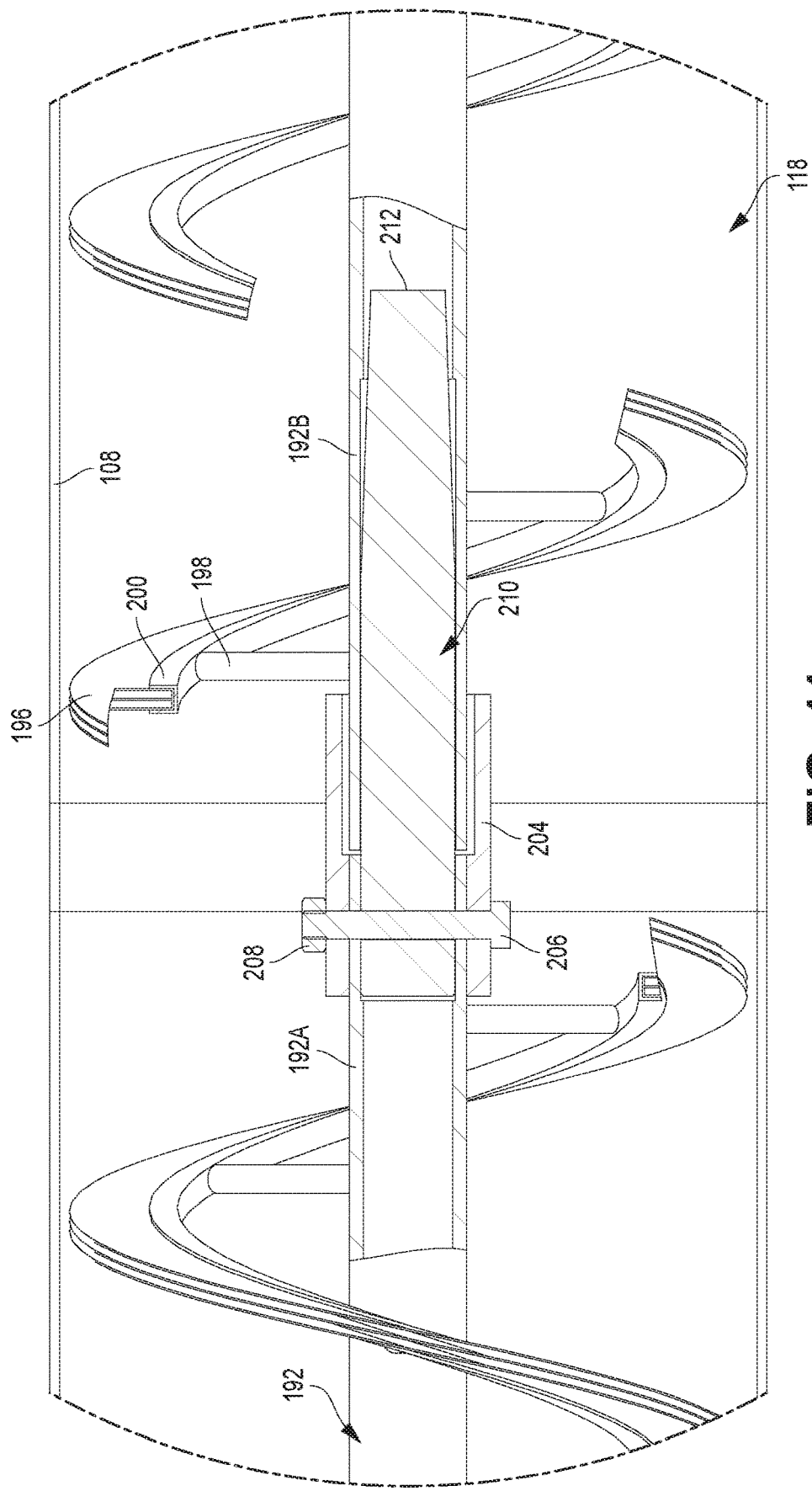
FIG. 11 is a sectional illustration representing features of the coupling joint illustrated in "Detail 11" of FIG. 2.

Referring generally to FIGS. 10 and 11, the horizontal support shaft 192 optionally consists of a primary support shaft 192A and a secondary support shaft 192B, which are coupled to each other via a support coupling 204 and secured in place with a support pin 206 and a support nut 208. This feature, in which the horizontal support shaft 192 has two or more segments, is generally useful when the length of the horizontal support shaft 192 becomes too long for practically using a single segment.

Referring more specifically to FIG. 10, the support coupling 204 wraps around and is pinned to the primary support shaft 192A via the support pin 206 and the support nut 208. Thus, the support coupling 204 is fixedly attached to the primary support shaft 192A. The support coupling 204 has a tapered opening 205 that allows a respective support spoke 198A of the secondary support shaft 192B to engage the support coupling 204, and thus the primary support shaft 192A, to insure that spiral flights 209 of the helical auger are aligned between the helical bristles elements 196 supported by both the primary and the secondary support shafts 192A, 192B.

Referring more specifically to FIG. 11, a pilot shaft 210 is inserted internally within the end of the primary support shaft 192A. The support pin and nut 206, 208, then, fixedly secures in place the support coupling 204 to the primary support shaft 192A and to the pilot shaft 210. The pilot shaft 210 has a tapered end 212 for guidance of the secondary support shaft 192B when coupling the primary and secondary support shafts 192A, 192B. The secondary support shaft 192B is inserted over the tapered end 212 of the pilot shaft 210 and held in place to the primary support shaft 192B via (a) the frictional contact between the internal surface of the secondary support shaft 192B and the external surface of the pilot shaft 210, and (b) the contact between the respective support spoke 198A and the tapered opening 205 of the support coupling 204.

Figure 12:
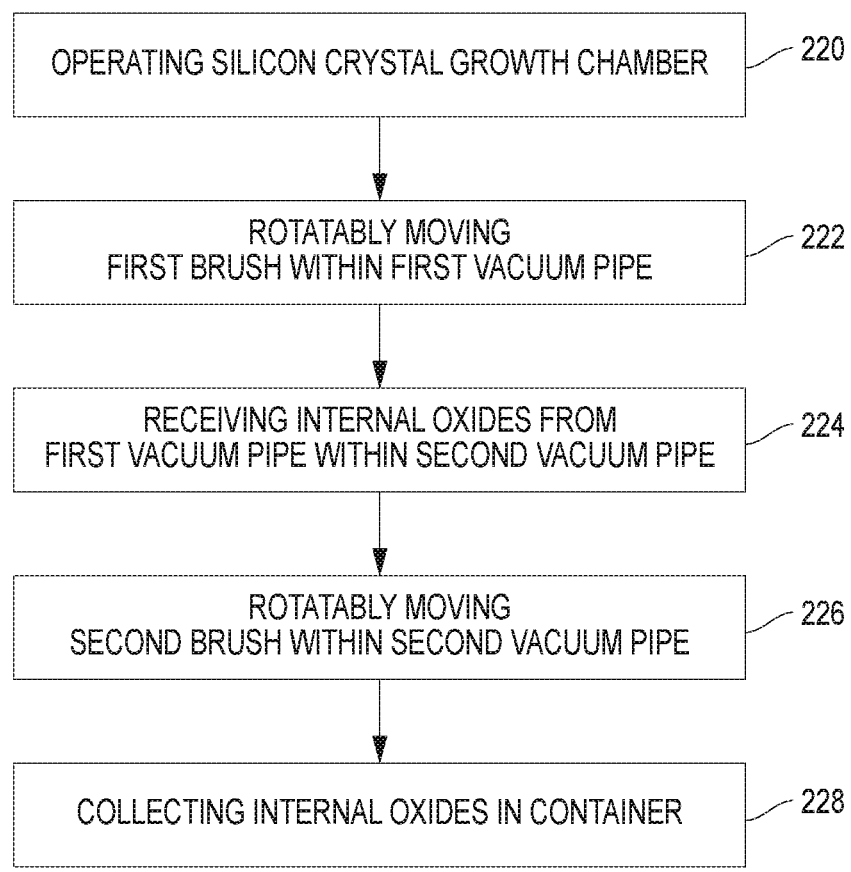
FIG. 12 illustrates a method for cleaning a vacuum system.

Referring to FIG. 12, a method for cleaning a vacuum system includes an operating step 220 in which a silicon crystal growth chamber is operated in a vacuum environment. The method further includes a rotatably moving step 222 in which a first brush is rotatably moved along an internal surface of a first vacuum pipe to remove internal oxides, the first vacuum pipe having a first axis oriented in a first direction. The method further includes a receiving step 224 in which the internal oxides from the first vacuum pipe are received within a second vacuum pipe, the second vacuum pipe having a second axis oriented in a second direction that is different than the first direction. The method further includes another rotatably moving step 226 in which a second brush is rotatably moved along an internal surface of the second vacuum pipe to move the internal oxides internally. The method further includes a collecting step 228 in which the internal oxides are collected in a container coupled to the second vacuum pipe.

Based on the present disclosure and for further clarity, the following are some exemplary benefits of the disclosed vacuum system and method:
the hollow center of the support ring 132, which is representative of a hollow core of the vertical rotating brush 114, helps reduce bridging of contaminants, including SiO;
the hollow interior between the horizontal support shaft 192 and the spiral channel 200, generally defined by the length of the support spokes 198, allows free flow of process gases along the internal diameter of the horizontal pipe 108;
the cleaning vacuum system 104 offers extended machine run times and shorter cleanout times between runs;
argon gas purges components of the cleaning vacuum system 104, such as rotating gears and bearings (e.g., brush drive gear 156), for cleanliness;
the vertical rotating brush 114 includes a beneficial feature in which the brush driven gear 158 is coupled to the support ring 132 via supporting pins 160 to provide ease of installation and removal;
the horizontal helical rotating brush 118 is optionally a two-piece design with a primary support shaft 192A and a secondary support shaft 192B that allows for easy removal and installation;
the two-piece design of the horizontal helical rotating brush 118 are uniquely coupled to insure alignment of spiral flights 209 (also referred to as auger blades), providing uninterrupted flow of transported oxides 142;
the horizontal helical rotating brush 118 is supported on its ends with spherical first and second support bearings 194, 202 to allow the horizontal support shaft 192 to conform to the internal diameter of the horizontal pipe 108;
the cleaning vacuum system 104 is applicable to any form of silicon crystal growth that applies a vacuum environment;
the cleaning vacuum system 104 is applicable to vertical, horizontal, and/or diagonal vacuum pipes;
the rotating brushes 114, 118 operate within the internal diameter of respective pipes 106, 108

According to one aspect of the present disclosure, the cleaning vacuum system 104 collects oxides 142 in two or more oxides containers 110 to reduce cleanout and/or downtime between runs. According to another aspect of the present disclosure, the vacuum system 100 is a two-port or a four-port vacuum system.

According to yet another aspect of the present disclosure, one or more of the stepper motors 150, 184 are coupled to gear-reducing heads that have a Programmable Logic Controller ("PLC") to allow, for example, the vertical rotating brush 114 to rotate at a rate of about 4 revolutions per hour ("RPH") and the horizontal helical rotating brush 118 to rotate at a rate of about 8 RPH. This slow, controlled, speed eliminates or greatly reduces vibrations caused by the brushes 114, 118 that could affect the stability of silicon melt in the growth chambers 102.

The PLC control is also beneficial for obstruction detection if a stop in rotation is detected. The PLC will automatically reverse the motor direction in an attempt to un-jam the obstruction.

According to an alternative embodiment, the rotation of the brushes 114, 118 is achieved manually, without using a motorized actuation or PLC control. For example, if needed and as applicable, the stepper motors 150, 184 are replaced with crank handles that are manually actuated for rotating the brushes 114, 118.

Each of these embodiments and obvious variations thereof is contemplated as falling within the spirit and scope of the claimed invention, which is set forth in the following claims. Moreover, the present concepts expressly include any and all combinations and sub-combinations of the preceding elements and aspects. The present disclosure is not limited to the specific illustrated example but extends to alternative embodiments other shapes and/or configurations in accordance with the knowledge of one of ordinary skill in the art applied consistent with the presently disclosed principles.

What is claimed is:

1. A vacuum system for silicon crystal growth, the vacuum system comprising:
a silicon crystal growth chamber;
a first vacuum pipe coupled to the chamber and having within a first brush that is movable in a first direction for removing internal oxides;
a second vacuum pipe coupled to the first vacuum pipe for receiving the internal oxides via the first brush, the second vacuum pipe having within a second brush that is movable in a second direction different from the first direction, the second brush transporting the received internal oxides away from the first vacuum pipe; and
an oxides container coupled to the second vacuum pipe for receiving the internal oxides via the second brush.

2. The vacuum system of claim 1, wherein the first direction is a vertical direction and the second direction is a horizontal direction.

3. The vacuum system of claim 1, wherein the first brush is a vertical paddle brush having a hollow core for reducing bridging of the internal oxides.

4. The vacuum system of claim 1, wherein the first brush includes a plurality of brush channels supported by a plurality of support rings, each channel of the plurality of brush channels including a respective bristles element for cleaning the first vacuum pipe in response to movingly contacting an internal surface of the first vacuum pipe.

5. The vacuum system of claim 1, wherein the first brush is attached to an interior surface of a brush driven gear via a plurality of drive pins, the brush driven gear having an exterior gear surface coupled to a brush drive gear for rotating the first brush.

6. The vacuum system of claim 5, further comprising a plurality of guide wheels in contact with the exterior gear surface for maintaining the brush driven gear in a level position.

7. The vacuum system of claim 1, wherein the second brush is a horizontal helical brush having a hollow core through which process gases freely flow.

8. The vacuum system of claim 1, wherein the second brush has an auger helical configuration that includes an internal rod supporting an auger component via a plurality of supporting pins, the auger component having an outward edge that is in movable contact with an internal surface of the second vacuum pipe, the auger component having an internal edge that is spaced from the internal rod.

9. The vacuum system of claim 1, further comprising a stepper motor coupled to the second brush via a coupling element, the coupling element being inserted through a spherical bearing that allows flexure of the second brush relative to the stepper motor.

10. The vacuum system of claim 1, further comprising:
a support shaft that is hollow and that supports a helical component of the second brush, the support shaft including a first segment having a first end and a second segment having a second end, the first end and the second end being adjacent to each other;
a coupling element that is hollow and within which the first end and the second end are received;
a pilot shaft inserted partially within each of the first segment and the second segment such that the pilot shaft overlaps both the first end and the second end; and
a coupling fin that secures the first end and the second end of the support shaft to the coupling element.

11. The vacuum system of claim 1, further comprising an argon gas pipe coupled to the first vacuum pipe, argon gas flowing from the argon gas pipe through the first vacuum pipe.

12. The vacuum system of claim 1, wherein the oxides container is directly connected to an end of the second vacuum pipe.

13. The vacuum system of claim 1, further comprising a first stepper motor coupled to the first brush and a second stepper motor coupled to the second brush, each of the first stepper motor and the second stepper motor causing movement of a respective one of the first brush and the second brush.

14. The vacuum system of claim 13, further comprising a first magnetic fluid seal positioned between the first brush and the first stepper motor and a second magnetic fluid seal between the second brush and the second stepper motor.

15. A vacuum system for silicon crystal growth, the vacuum system comprising:
a silicon crystal growth chamber operating in a vacuum environment;
a vertical vacuum pipe coupled to the chamber and including within a vertical brush, the vertical brush having a vertical bristles element that is rotatably movable around a central axis of the vertical vacuum pipe, the vertical bristles element removing deposited oxides in response to moving, frictional contact with an internal surface of the vertical vacuum pipe;
a horizontal vacuum pipe coupled to the vertical vacuum pipe for receiving the oxides, the horizontal vacuum pipe including within a horizontal brush having an auger component that is rotatably movable around a central axis of the horizontal vacuum pipe, the auger component having a horizontal bristles element that makes moving, frictional contact with an internal surface of the horizontal vacuum pipe to transport the oxides along the horizontal vacuum pipe; and
an oxides container coupled to the horizontal vacuum pipe for collecting the oxides received from the horizontal vacuum pipe.

16. The vacuum system of claim 15, wherein the vertical brush includes a supporting ring that is connected to the vertical bristles element on an outer surface, the supporting ring being further rotatably movingly coupled to a stepper motor via a pair of engaging gears.

17. The vacuum system of claim 15, wherein the horizontal brush has a support shaft that is positioned along the central axis of the horizontal vacuum pipe, the support shaft being laterally coupled to the auger component via a plurality of support spokes, the support shaft having an end rotatably movingly coupled to a stepper motor.

18. A method for cleaning a vacuum system, the method comprising:
operating a silicon crystal growth chamber in a vacuum environment;
rotatably moving a first brush along an internal surface of a first vacuum pipe to remove internal oxides, the first vacuum pipe having a first axis oriented in a first direction;
receiving the internal oxides from the first vacuum pipe within a second vacuum pipe, the second vacuum pipe having a second axis oriented in a second direction that is different than the first direction;
rotatably moving a second brush along an internal surface of the second vacuum pipe to move the internal oxides internally; and
collecting the internal oxides in a container coupled to the second vacuum pipe.

19. The method of claim 18, further comprising actuating at least one of the first brush and the second brush with a respective stepper motor.

20. The method of claim 18, further comprising automatically reversing a rotation of at least one of the first brush or the second brush in response to detecting an obstruction.

\* \* \* \* \*